(12) United States Patent
Bonilla et al.

(10) Patent No.: US 8,809,183 B2
(45) Date of Patent: Aug. 19, 2014

(54) INTERCONNECT STRUCTURE WITH A PLANAR INTERFACE BETWEEN A SELECTIVE CONDUCTIVE CAP AND A DIELECTRIC CAP LAYER

(75) Inventors: Griselda Bonilla, Fishkill, NY (US); Lawrence A. Clevenger, LaGrangeville, NY (US); Elbert E. Huang, Carmel, NY (US); Satyanarayana V. Nitta, Poughquag, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 12/887,010

(22) Filed: Sep. 21, 2010

(65) Prior Publication Data

US 2012/0068344 A1  Mar. 22, 2012

(51) Int. Cl.
*H01L 21/4763* (2006.01)
(52) U.S. Cl.
USPC ............................ 438/618; 438/597; 438/631
(58) Field of Classification Search
USPC .......................................... 438/597, 618, 631
See application file for complete search history.

(56) References Cited

U.S. PATENT DOCUMENTS

| | | | |
|---|---|---|---|
| 6,521,523 B2 | 2/2003 | Lee et al. | |
| 6,893,959 B2 | 5/2005 | Barth | |
| 6,975,032 B2 | 12/2005 | Chen et al. | |
| 7,105,445 B2 | 9/2006 | Wong et al. | |
| 7,514,361 B2 | 4/2009 | Bonilla et al. | |
| 2005/0191851 A1 | 9/2005 | Liu et al. | |
| 2005/0275100 A1 | 12/2005 | Yakobson et al. | |
| 2005/0287826 A1* | 12/2005 | Abell et al. | 438/900 |
| 2006/0024976 A1* | 2/2006 | Waldfried et al. | 438/778 |
| 2006/0175708 A1 | 8/2006 | Ueno | |
| 2007/0032058 A1* | 2/2007 | Sung | 438/597 |
| 2007/0224811 A1* | 9/2007 | Wang et al. | 438/678 |
| 2007/0232046 A1* | 10/2007 | Miyata et al. | 438/597 |
| 2007/0243720 A1* | 10/2007 | Ko et al. | 438/778 |
| 2008/0102599 A1 | 5/2008 | Yang | |
| 2008/0197499 A1 | 8/2008 | Yang et al. | |
| 2008/0254624 A1 | 10/2008 | Yang et al. | |
| 2008/0258303 A1 | 10/2008 | Yeh et al. | |
| 2008/0315426 A1 | 12/2008 | Yang et al. | |
| 2009/0189287 A1 | 7/2009 | Yang et al. | |
| 2009/0250815 A1 | 10/2009 | Yang et al. | |
| 2010/0133648 A1* | 6/2010 | Seidel et al. | 257/522 |
| 2010/0276805 A1* | 11/2010 | Tu et al. | 257/760 |

\* cited by examiner

*Primary Examiner* — Jae Lee
(74) *Attorney, Agent, or Firm* — Scully, Scott, Murphy & Presser, P.C.; Wenjie Li

(57) ABSTRACT

A selective conductive cap is deposited on exposed metal surfaces of a metal line by electroless plating selective to exposed underlying dielectric surfaces of a metal interconnect structure. A dielectric material layer is deposited on the selective conductive cap and the exposed underlying dielectric layer without a preclean. The dielectric material layer is planarized to form a horizontal planar surface that is coplanar with a topmost surface of the selective conductive cap. A preclean is performed and a dielectric cap layer is deposited on the selective conductive cap and the planarized surface of the dielectric material layer. Because the interface including a surface damaged by the preclean is vertically offset from the topmost surface of the metal line, electromigration of the metal in the metal line along the interface is reduced or eliminated.

19 Claims, 5 Drawing Sheets

INTERCONNECT STRUCTURE WITH A PLANAR INTERFACE BETWEEN A SELECTIVE CONDUCTIVE CAP AND A DIELECTRIC CAP LAYER

BACKGROUND

The present disclosure relates to an interconnect structure, and particularly to an electromigration-resistant interconnect structure having a planar interface between a selective conductive cap and a dielectric cap layer on a metal line, and methods of manufacturing the same.

A metal line comprises a lattice of metal ions and non-localized free electrons. The metal ions are formed from metal atoms that donate some of their electrons to a common conduction band of the lattice, and the non-localized free electrons move with relatively small resistance within the lattice under an electric field. Normal metal lines, excluding superconducting materials at or below a superconducting temperature, have finite conductivity, which is caused by interaction of electrons with crystalline imperfections and phonons which are thermally induced lattice vibrations. In practice, copper and aluminum are most common metals that are employed as the material for metal lines in interconnect structures in a semiconductor chip.

When electrical current flows in the metal line, the metal ions are subjected to an electrostatic force due to the charge of the metal ion and the electric field to which the metal ion is exposed to. Further, as electrons scatter off the lattice during conduction of electrical current, the electrons transfer momentum to the metal ions in the lattice of the metal line. The direction of the electrostatic force is in the direction of the electric field, i.e., in the direction of the current, and the direction of the force due to the momentum transfer of the electrons is in the direction of the flow of the electrons, i.e., in the opposite direction of the current. However, the force due to the momentum transfer of the electrons is generally greater than the electrostatic force. Thus, metal ions are subjected to a net force in the opposite direction of the current, or in the direction of the flow of the electrons.

Metal lines are formed by a process called a damascene process, in which trenches and/or vias are formed in a dielectric layer and metal is inlaid into the trenches. Subsequently, excess metal above the topmost surface of the dielectric layer is removed by planarization, which can be effected for example, by chemical mechanical planarization. After planarization, the top surface of the remaining metal and the top surface of the remaining dielectric material are coplanar, i.e., located within the same horizontal plane. The remaining metal constitutes the metal lines that are embedded within the dielectric layer.

To reduce electromigration of the metal lines, a dielectric cap layer is deposited directly on the metal line. By atomically bonding to the uppermost surfaces of the material of the underlying metal line, the dielectric cap layer retards electromigration of the metal. In order to deposit the dielectric cap layer that atomically adheres to the underlying metal, however, it is necessary to remove non-metallic materials from the surface of the metal liners. Typically, the non-metallic materials are oxides of the metal of the underlying metal line, and may include additional contaminants. For example, if the underlying metal line is a copper line, the non-metallic oxide can be a surface layer of copper oxide, and if the underlying metal line is an aluminum line, the non-metallic oxide can be a surface layer of aluminum oxide. Without the removal of such non-metallic materials on the surface of metal lines, the dielectric cap layer can lose most of its effectiveness.

Thus, a "preclean" process is a required step before deposition of an effective dielectric cap layer. Because the metal oxides are bonded to the underlying metal line with good adhesion, significant energy must be imparted to dislodge the metal oxides and to expose metal atoms of the underlying metal line. Unfortunately, the same energy is applied to surfaces of exposed dielectric materials, which can suffer structural damages when significant energy is applied thereto. Typically, the preclean process employs plasma treatment with high energy density and/or physical sputtering by inert ions such as argon ions. Such a preclean process can significantly damage a dielectric material having a low dielectric constant, i.e., the dielectric constant of 3.9, which is a dielectric constant less than the dielectric constant of silicon oxide. Such materials include organosilicate glasses, which are SiCOH-based materials deposited by chemical vapor deposition (CVD). The degree of the damage to the exposed surface of the dielectric material increases in the case of porous dielectric materials, which are employed to form a dielectric layer having an ultra-low dielectric constant, i.e., a dielectric constant less than 2.4.

The damage to the exposed dielectric material during the preclean process has a significant adverse effect on TDDB reliability of the metal interconnect structure. The interface between the damaged underlying dielectric material and the dielectric cap layer includes many cavities and chemical properties that are conducive to electromigration between adjacent metal lines. The horizontal interface is coplanar with the top surfaces of the metal lines. TDDB failure in this case is causes by metal ions migrating under an electric field. (this is different from electromigration) Eventually, migration of metal continues along the horizontal interface between the damaged underlying dielectric layer and the dielectric cap layer during the lifetime of a semiconductor chip including this interconnect structure. Once sufficient migration occurs between adjacent metal lines, the two metal lines become electrically shorted, causing a circuit failure in the semiconductor chip. Thus, the damage to the underlying dielectric that occurs during the preclean process has a direct adverse impact on reliability, notwithstanding the benefit of enabling direct atomic contact between the metal of the underlying metal line and the dielectric cap layer and thereby retarding TDDB failure through a different mechanism.

BRIEF SUMMARY

A selective conductive cap is deposited on exposed metal surfaces of a metal line by electroless plating selective to exposed underlying dielectric surfaces of a metal interconnect structure. A dielectric material layer is deposited on the selective conductive cap and the exposed underlying dielectric layer without a preclean. The dielectric material layer is planarized to form a horizontal planar surface that is coplanar with a topmost surface of the selective conductive cap. A preclean is performed and a dielectric cap layer is deposited on the selective conductive cap and the planarized surface of the dielectric material layer. Because the interface including a surface damaged by the preclean is vertically offset from the topmost surface of the metal line, electromigration of the metal in the metal line along the interface is reduced or eliminated.

According to an aspect of the present disclosure, a metal interconnect structure includes: a metal line embedded in an underlying dielectric layer and having a top surface that is coplanar with a top surface of the underlying dielectric layer; a conductive cap having a bottom surface in contact with, and coextensive with, the top surface of the metal line; a dielectric material layer contacting the underlying dielectric layer and having a top surface that is coplanar with a top surface of the conductive cap; and a dielectric cap layer contacting the dielectric material layer and the conductive cap and including a different material than the dielectric material layer.

According to another aspect of the present disclosure, a method of forming a metal interconnect structure includes: forming an underlying dielectric layer on a substrate; forming a metal line within the underlying dielectric layer, wherein the metal line has a top surface that is coplanar with a top surface of the underlying dielectric layer; forming a conductive cap selectively on the metal line, wherein the conductive cap is not deposited directly on the underlying dielectric layer; forming a dielectric material layer over the conductive cap and the underlying dielectric layer; and planarizing the dielectric material layer, wherein a planarized top surface of the dielectric material layer is coplanar with a top surface of the conductive cap.

DETAILED DESCRIPTION

Figure 1:
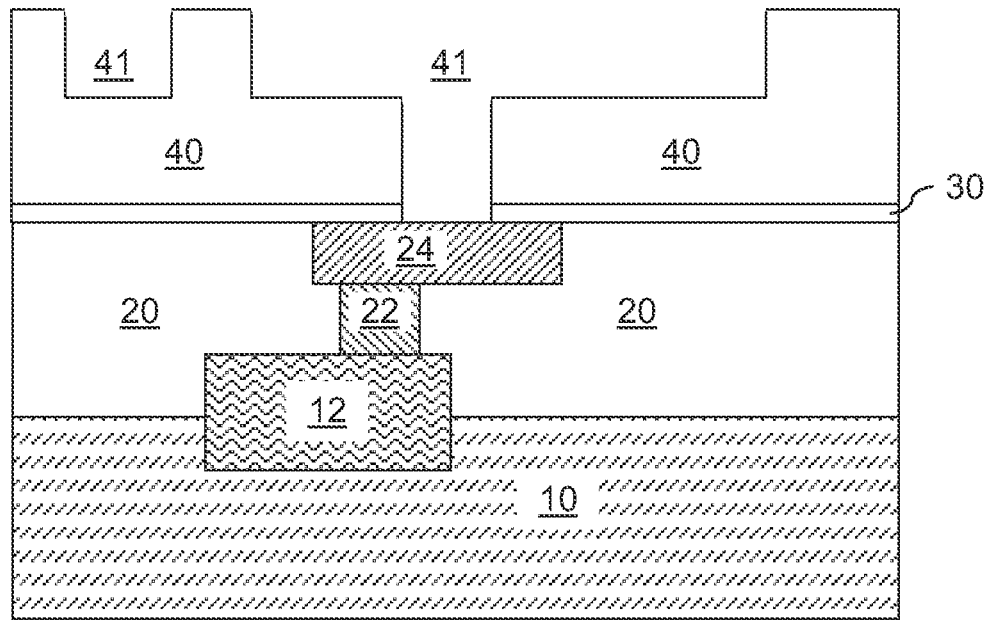
FIG. 1 is a vertical cross-sectional view of an exemplary structure after formation of trenches in an underlying dielectric layer.

As stated above, the present disclosure relates to an electromigration-resistant interconnect structure having a planar interface between a selective conductive cap and a dielectric cap layer on a metal line, and methods of manufacturing the same, which are now described in detail with accompanying figures. It is noted that like reference numerals refer to like elements across different embodiments.

Referring to FIG. 1, an exemplary structure according to the present disclosure includes a substrate 10 and a metal interconnect structure formed thereupon. The substrate 10 can be a semiconductor substrate including a semiconductor material. For example, the substrate 10 can be a bulk semiconductor substrate, a semiconductor-on-insulator substrate, or a hybrid substrate including at least one bulk semiconductor portion and at least one semiconductor-on-insulator portion. At least one semiconductor device 12 can be formed on the substrate 10. The at least one semiconductor device 12 can be a field effect transistor, a bipolar transistor, a diode, a varactor, a silicon controlled rectifier, a capacitor, a resistor, an inductor, an optical device, and/or a combination thereof.

At least one lower-level interconnect structure can be formed over the at least one semiconductor device 12. The at least one lower-level interconnect structure can include at least one lower level dielectric layer 20, at lest one lower-level conductive via 22, and at least one lower-level metal line 24. The at least one lower level dielectric layer 20 can include a dielectric material such as silicon oxide, silicon nitride, a porous and/or non-porous organosilicate glass containing CVD-deposited SiCOH-based material, an undoped or nitrogen-doped hydrogen-containing silicon carbide material, and/or a combination thereof. The at lest one lower-level conductive via 22 and at least one lower-level metal line 24 includes a metallic material such as copper, aluminum, tungsten, a conductive metal nitride, or a combination thereof.

A stack of an underlying dielectric cap layer 30 and an underlying dielectric layer 40 are deposited, for example, by chemical vapor deposition (CVD). The underlying dielectric cap layer 30 can include silicon nitride, silicon oxynitride, and/or undoped or nitrogen-doped hydrogen-containing silicon carbide material. The underlying dielectric layer 40 can include porous or non-porous organosilicate glass, which contains a CVD-deposited SiCOH-based material. In one embodiment, the underlying dielectric layer 40 includes a porous organosilicate glass. In another embodiment, the underlying dielectric layer 40 includes a non-porous organosilicate glass.

Trenches 41 are formed in the underlying dielectric layer 40. The trenches 41 includes line trenches extending laterally above a certain level within the underlying dielectric layer 40 and via trenches extending vertically through the entirety of the underlying dielectric layer 40 and through the portion of the underlying dielectric cap layer 30 located directly underneath to expose a surface of one of the at least one lower-level metal line 24. While the trenches 41 are illustrated as dual damascene trenches, embodiments in which single damascene trenches are formed either at a line level or at a via level can also be practiced.

Figure 2:
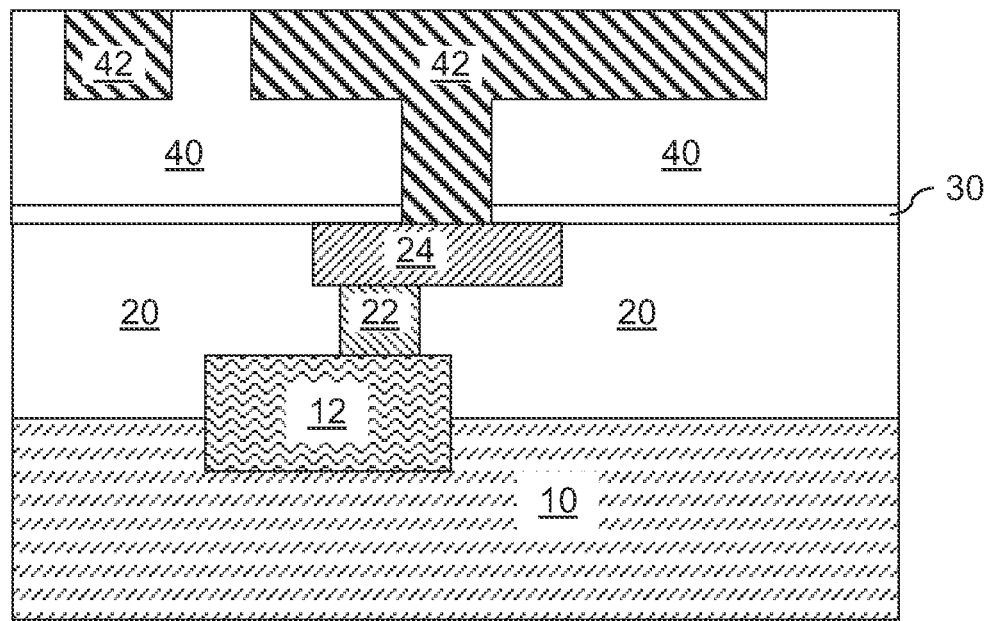
FIG. 2 is a vertical cross-sectional view of the exemplary structure after formation of metal lines.

Referring to FIG. 2, metal lines 42 are formed by filling the trenches 41 with at least one conductive metallic material, which can be an elemental metal, an intermetallic alloy of at least two elemental metals, a conductive metal oxide of at least one metal, a conductive metal nitride of at least one metal, and/or a combination thereof. The trenches 41 can be filled by deposition of the at least one conductive metallic material, for example, by physical vapor deposition (PVD), electroplating, chemical vapor deposition, or a combination thereof. The excess conductive material above the horizontal top surface of the underlying dielectric layer 40 is removed by planarization, which can be effected by chemical mechanical planarization, a recess etch, or a combination thereof. The remaining portions of the at least one conductive metallic material underneath the topmost surface of the underlying dielectric layer forms the metal lines 42.

The metal lines 42 can be formed as a conductive structure in which vertical conductive via are integrated therein in a dual damascene scheme. The metal lines 42 are embedded in the underlying dielectric layer 40, and the topmost surfaces of the metal lines 42 are coplanar with the topmost surface of the underlying dielectric layer 40. Typically, each of the metal lines 42 includes a copper line structure laterally bounded by a metallic liner that promotes adhesion and blocks through-diffusion of impurities. Exemplary metallic liner materials include TiN, TaN, and WN.

Figure 3:
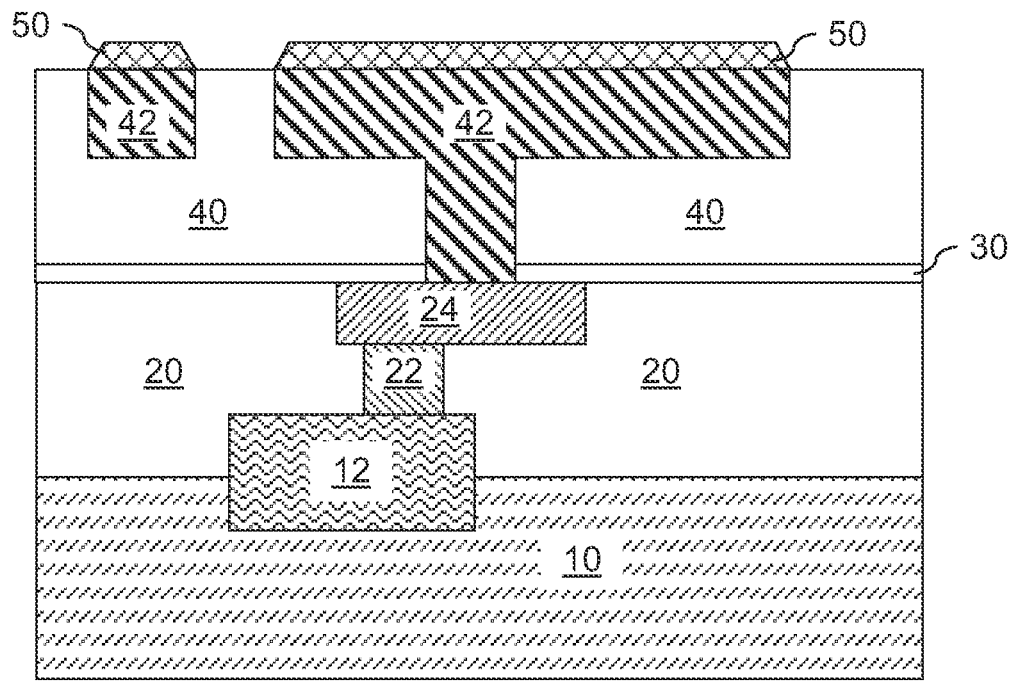
FIG. 3 is a vertical cross-sectional view of the exemplary structure after formation of selective conductive caps.

Referring to FIG. 3, selective conductive caps 50 are deposited on exposed top surfaces of the metal lines 50. The selective conductive caps 50 are conductive caps which are deposited only on metallic surfaces selective to dielectric surfaces. In other words, the selective conductive caps 50 are deposited only on metallic surfaces, but are not deposited on dielectric surfaces. Thus, the selective conductive caps 50 are not deposited directly on the underlying dielectric layer 40. Each selective conductive cap 50 has a bottom surface that is in contact with, and coextensive with, the top surface of a metal line. The outer perimeter of the bottom surface of each selective conductive cap 50 coincides with an outer perimeter of the top surface of the underlying metal line 42.

In one embodiment, the selective conductive caps 50 are deposited by electroless plating. Electroless plating is a non-galvanic type of plating method that involves several simultaneous reactions in an aqueous solution, which occur without the use of external electrical power. The reaction is accomplished when hydrogen is released by a reducing agent, normally sodium hypophosphite, and oxidized thus producing a negative charge on the surface of the part. Correspondingly, the selective conductive cap 50 is composed of an electrolessly platable metal. As used herein, an "electrolessly platable metal" is a metal for which an electroless plating process is known, i.e., a metal that can be deposited by employing a known electroless plating process.

Electrolessly platable metals include CoWP, Ni, Co, and Au. Method of electrolessly plating CoWP is described in U.S. Pat. No. 5,695,810 to Dubin et al., which is incorporated herein by reference. Ni, Co, and Au can be electrolessly plated as an elemental metal, and methods of electrolessly plating Ni, Co, or Au are known in the art. The selective conductive caps 50 can include a single electrolessly platable metal or a stack of at least two electrolessly platable metals.

Depending on the chemistry employed to perform the electroless plating process, facets may develop around the periphery of the selective conductive caps 50. In this case, the selective conductive caps 50 may have faceted sidewalls, and the top surface of each selective conductive cap 50 can have a lesser area than the bottom surface of that selective conductive cap 50 due to the facets, which tend to tilt inward.

In another embodiment, the selective conductive caps 50 can be deposited by selective chemical vapor deposition (CVD) or by selective atomic layer deposition (ALD), in which a conductive material is deposited only on metallic surfaces but is not deposited on a dielectric surface. Selective CVD processes and selective ALD processes for some metals are known in the art. For example, the selective conductive caps 50 may include ruthenium, which can be deposited by selective CVD or by selective ALD. Depending on the process parameters, facets may develop on the selective conductive caps 50.

The thickness of the selective conductive caps 50 can be from 2 nm to 30 nm, and typically from 5 nm to 10 nm, although lesser and greater thicknesses can also be employed.

Figure 4:
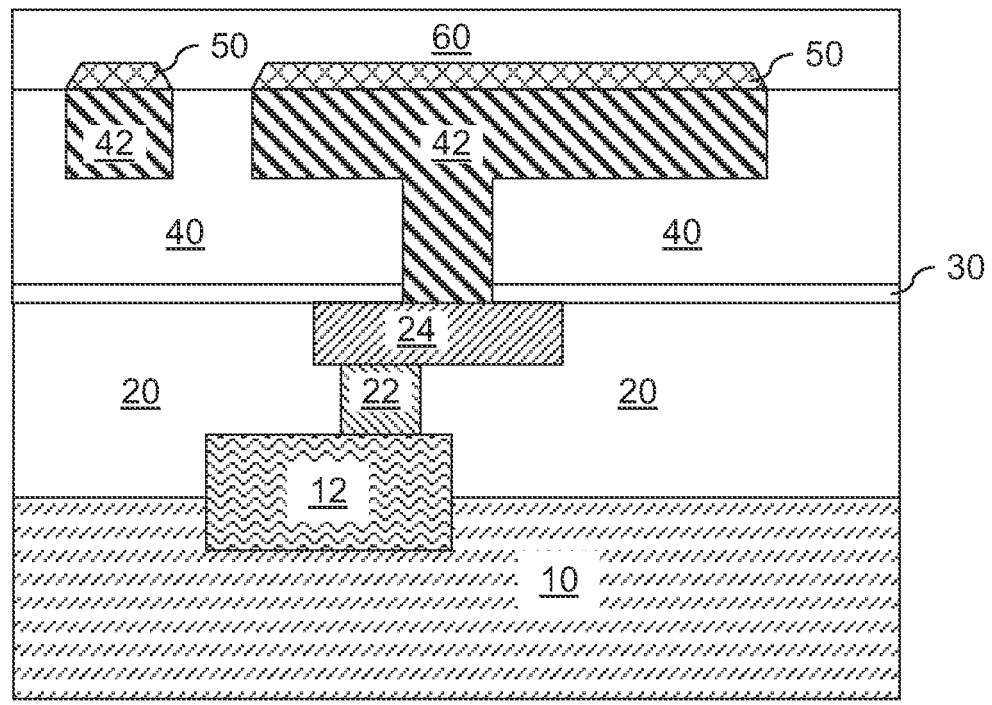
FIG. 4 is a vertical cross-sectional view of the exemplary structure after formation of a dielectric material layer.

Referring to FIG. 4, a dielectric material layer 60 is deposited over the selective conductive caps 50 and the exposed surfaces of the underlying dielectric layer 40. No preclean is performed prior to deposition of the dielectric material layer 60. As used herein, a "preclean" is a process that is capable of removing at least one monolayer of metal oxide from a metal surface. A preclean can be a sputtering process employing an energetic particle, or a plasma process in which plasma reduces a surface metal oxide into an unoxidized metal by removing the oxygen from the surface metal oxide. For example, precleans include argon sputtering processes or similar sputtering processes employing an inert element as well as a hydrogen-containing plasma that removes oxygen from a surface of a metal oxide such as copper oxide.

It is understood that all processes above a temperature at which the dielectric material of the underlying dielectric layer 40 dissociates by thermal decomposition are precluded from discussion. Organosilicate glass is structurally damaged at a prolonged exposure at 400 degrees Celsius, and decomposes at about 450 degrees Celsius. Thus, a thermal dissociation of copper oxide, which requires a temperature of about 850 degrees Celsius or higher, is not applicable or practicable for the purposes of building metal interconnect structures.

In one embodiment, the dielectric material of the dielectric material layer 60 is the same material as the dielectric material of the underlying dielectric layer 40, i.e., the dielectric material layer 60 and the underlying dielectric layer 40 have the same material composition. The common dielectric material of the dielectric material layer 60 and the underlying dielectric material layer 40 can be a non-porous organosilicate glass or a porous organosilicate glass.

In another embodiment, the dielectric material of the dielectric material layer 60 is different from the dielectric material of the underlying dielectric layer 40, i.e., the dielectric material layer 60 and the underlying dielectric layer 40 have different material compositions. In some cases, the dielectric material layer 60 includes a dielectric material that is not an organosilicate glass. In such cases, the dielectric material layer 60 can include silicon oxide, silicon nitride, silicon oxynitride, a hydrogenated silicon carbide (commonly referred to as BLoK™), a nitrogen-doped hydrogenated silicon carbide (commonly referred to as NBloK™), or a combination thereof.

In some other cases, the underlying dielectric layer 40 can be an organosilicate glass having one type of composition, i.e., a set of percentages for Si, C, O, and H. The dielectric material layer 60 can be another organosilicate glass having a different type of composition.

Alternately or in addition, the dielectric material layer 60 can include a non-porous organosilicate glass, and the underlying dielectric layer 40 can include a porous dielectric material. The advantage of employing a porous dielectric material for the underlying dielectric layer 40 and a non-porous dielectric material for the dielectric material layer 60 is that the porous dielectric material provides a lower dielectric constant compared with a non-porous dielectric material, but a non-porous dielectric material is more resistant to structural damage during a preclean process. By employing a non-porous material for the dielectric material layer 60, the top surface of the dielectric material layer 60 becomes more resistant to structural damage during a preclean process to be subsequently employed.

The thickness of the dielectric material layer 60 is greater than the thickness of the selective conductive caps 50, and can be from 3 nm to 100 nm, and typically from 6 nm to 30 nm, although lesser and greater thicknesses can also be employed. The dielectric material layer 60 can be deposited by plasma enhanced chemical vapor deposition that does not employ any preclean as discussed above.

Figure 5:
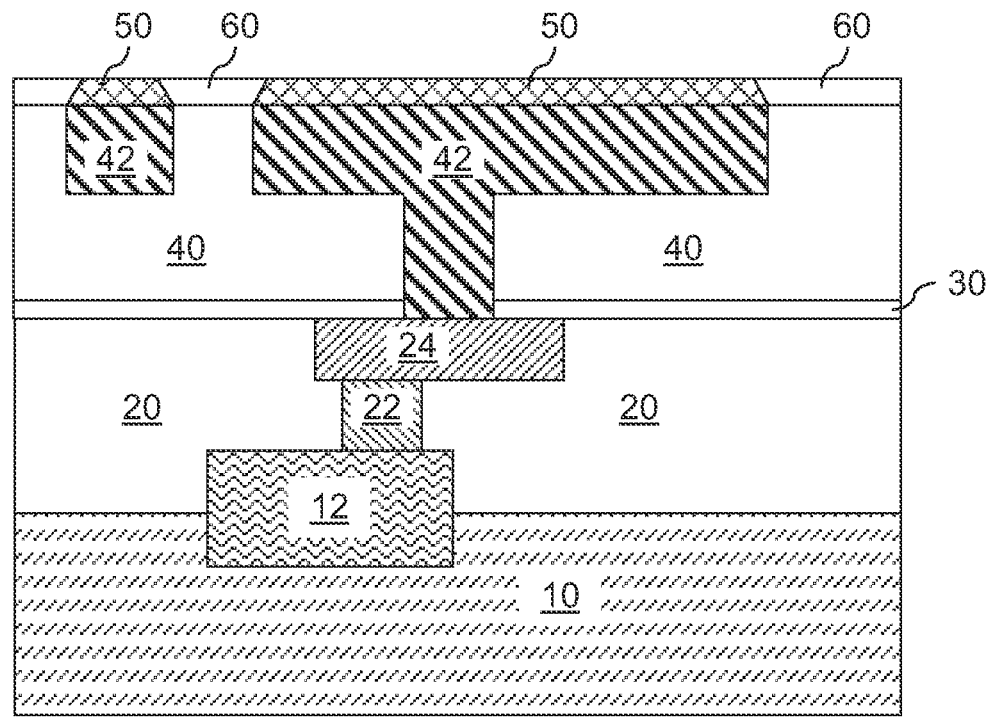
FIG. 5 is a vertical cross-sectional view of the exemplary structure after planarizing the dielectric material layer.

Referring to FIG. 5, the dielectric material layer 60 is planarized, for example, by chemical mechanical planarization. Specifically, the portion of the dielectric material layer 60 above the top surfaces of the selective conductive caps 50 is removes such that the planarized top surface of the dielectric material layer 60 is coplanar with the top surfaces of the selective conductive caps 50.

Figure 6:
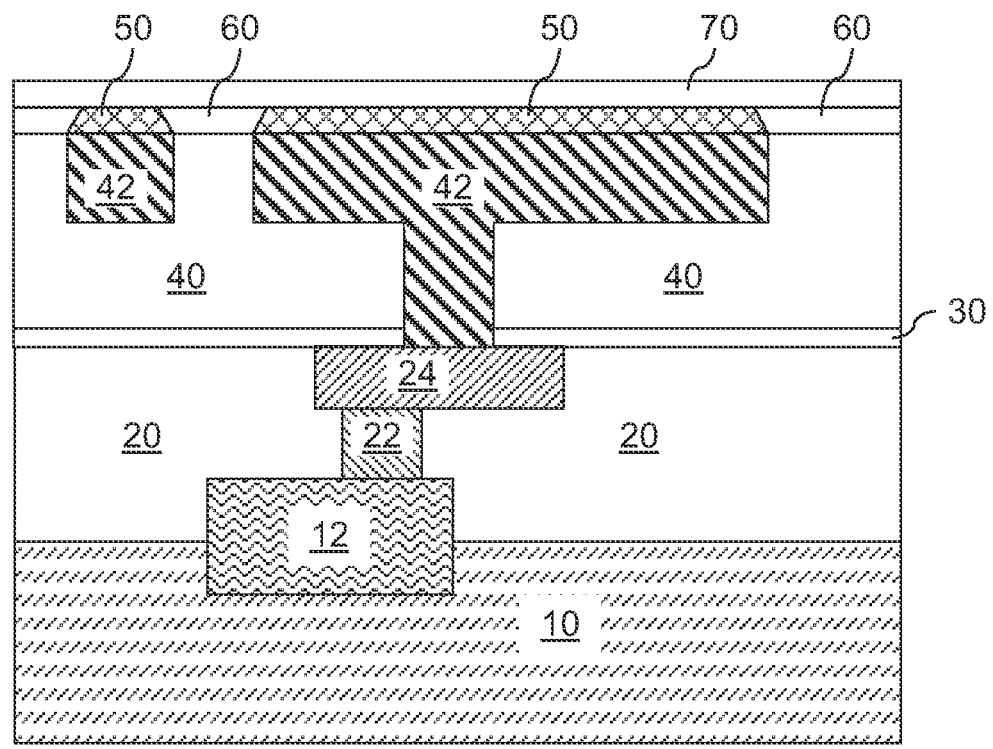
FIG. 6 is a vertical cross-sectional view of the exemplary structure after deposition of a dielectric cap layer.

Referring to FIG. 6, a dielectric cap layer 70 is deposited on the dielectric material layer 60 after performing a preclean. The dielectric cap layer 70 includes silicon oxide, silicon nitride, silicon oxynitride, a hydrogenated silicon carbide (commonly referred to as BLoK™), a nitrogen-doped hydrogenated silicon carbide (commonly referred to as NBloK™), or a combination thereof. If the dielectric material layer 60 includes silicon oxide, silicon nitride, silicon oxynitride, a hydrogenated silicon carbide (commonly referred to as BLoK™), a nitrogen-doped hydrogenated silicon carbide (commonly referred to as NBloK™), or a combination thereof, the dielectric cap layer 70 and the dielectric material layer 60 can include the same material, or different materials.

The preclean can include a sputter clean employing energetic particles that bombard the surface oxide material at the top surface of the selective conductive caps 50. For example, the top surfaces of the selective conductive caps 50 can be cleaned in a vacuum chamber by energetic argon particles, which dislodge metal oxides from the top surface of the selective conductive caps 50 to expose surfaces containing non-oxidized metal.

Alternately or additionally, the preclean can include a plasma clean in which hydrogen-containing plasma reduces surfaces oxides at the top surface of the selective conductive caps 50 to unoxidized metal surfaces. As discussed above, some structural damages to the dielectric material layer 60 may occur if the dielectric material layer 60 includes organosilicate glass. In this case, the preclean has a tendency of increasing the density of the damaged surface portion of the dielectric material layer 60. Thus, the surface portion of the dielectric material layer 60 at the top surface of the dielectric material layer has a greater density than the average density of the dielectric material layer 60 because of the preclean. If the surface of the dielectric material layer 60 exposed to the preclean includes silicon oxide, silicon nitride, or silicon oxynitride, the damage to the surface of the dielectric material layer 60 can be minimal.

The interface subjected to a preclean is vertically offset from the topmost surfaces of the metal lines 42. Because the material (e.g., CoWP, Ni, Co, Au, or Ru) of the selective conductive caps 50 is less prone to diffusion than the material (e.g., Cu or Al) of the metal lines 42, the metal interconnect structure of FIG. 6 is less prone to TDDB failure than prior art metal interconnect structures in which an interface subjected to a preclean and structural damage is coplanar with top surfaces of metal lines.

Figure 7:
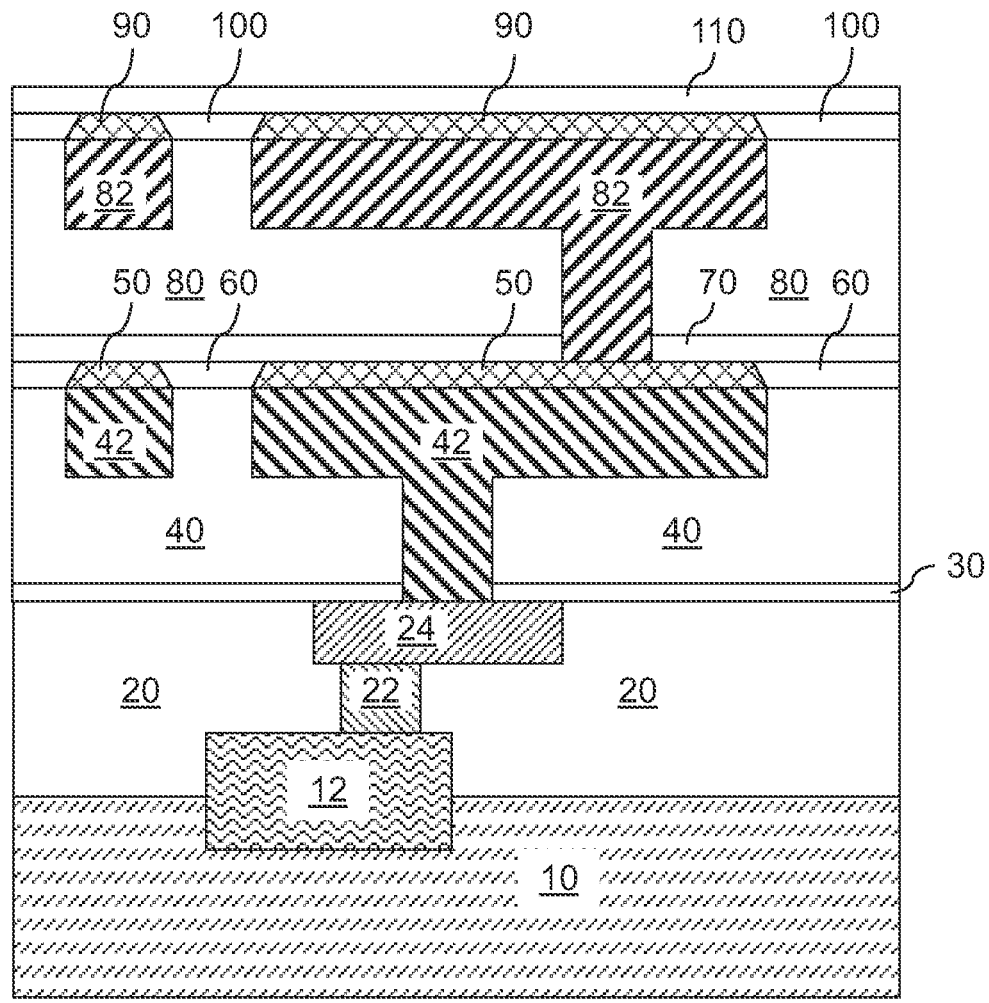
FIG. 7 is a vertical cross-sectional view of the exemplary structure after formation of another level of interconnect structure, which employs additional selective conductive caps and another dielectric cap layer.

Referring to FIG. 7, the processing steps of FIGS. 1-6 can be repeatedly applied to build additional levels of a metal interconnect structure. Each additional level of the metal interconnect structure may include an overlying dielectric layer 80 which can have the same structural features and composition as the underlying dielectric layer 40 (except that the structural features are replicated at a different level), overlying metal lines 82 which can have the same structural features and composition as the metal lines 42, overlying selective conductive caps 90 which can have the same structural features and composition as selective conductive caps 60, an overlying dielectric material layer 100 which can have the same structural features and composition as the dielectric material layer 60, and the overlying dielectric cap layer 110 which can have the same structural features and composition as the dielectric cap layer 70.

Figure 8:
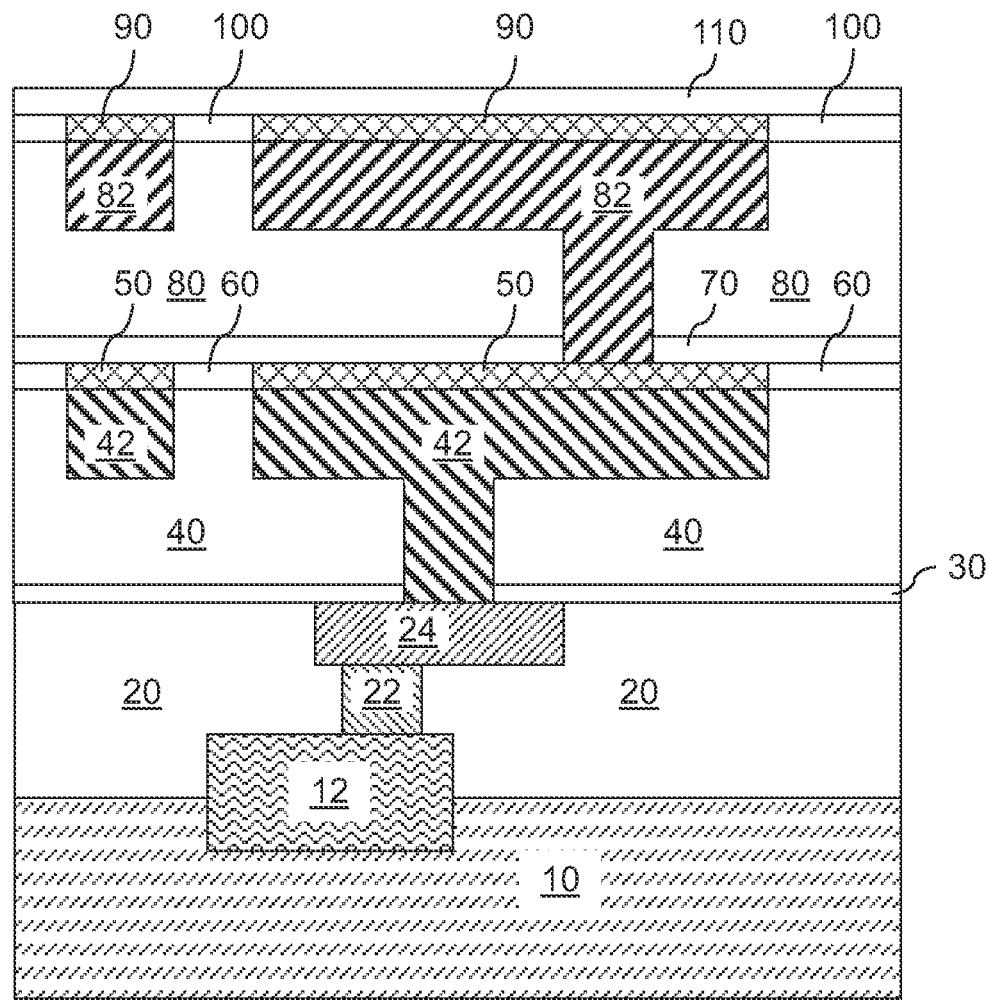
FIG. 8 is a vertical cross-sectional view of a variation of the exemplary structure in which selective conductive caps are formed without faceting.

Referring to FIG. 8, a variation of the exemplary structure illustrates an embodiment in which the selective conductive caps 50 and the overlying selective conductive caps 90 are formed without faceting. If the faceting does not occur, the top surfaces and the bottom surfaces of the selective conductive caps 50 can have the same area. Likewise, the top surfaces and the bottom surfaces of the overlying selective conductive caps 50 can have the same area, if the faceting does not occur.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a metal interconnect structure comprising:
    forming an underlying dielectric layer on a substrate, wherein the underlying dielectric layer is comprised of a porous material;
    forming a metal line within said underlying dielectric layer, wherein said metal line has a top surface that is coplanar with a top surface of said underlying dielectric layer;
    depositing a conductive cap selectively on said metal line, wherein said conductive cap is not deposited directly on said underlying dielectric layer;
    forming a dielectric material layer over said conductive cap and an entirety of said underlying dielectric layer without exposing said underlying dielectric layer to any preclean, wherein the dielectric material layer is non-porous;
    planarizing said dielectric material layer, wherein a planarized top surface of said dielectric material layer is coplanar with a top surface of said conductive cap and a bottommost surface of said dielectric material layer is coplanar with said top surface of said metal line, and wherein planarized dielectric material layer portions of said dielectric material layer remain on said entirety of said underlying dielectric layer; and
    precleaning a topmost surface of said conductive cap to remove metal oxide from said topmost surface of the conductive cap and to provide a topmost non-oxidized metal surface, wherein said precleaning occurs after said planarizing said dielectric material layer.

2. The method of claim 1, wherein said conductive cap comprises an electrolessly platable metal.

3. The method of claim 2, wherein said conductive cap comprises a metal selected from CoWP, Ni, Co, Au, and a stack thereof.

4. The method of claim 1, wherein said dielectric material layer comprises an organosilicate glass, and said underlying dielectric layer comprises another organosilicate glass.

5. The method of claim 1, further comprising forming a dielectric cap layer directly on said dielectric material layer and said conductive cap, wherein said dielectric cap layer comprises a different material than said dielectric material layer.

6. The method of claim 5, wherein said dielectric cap layer comprises a silicon nitride or a nitrogen-doped hydrogenated silicon carbide.

7. A metal interconnect structure comprising:
    a metal line embedded in an underlying porous dielectric layer and having a top surface that is coplanar with a top surface of said underlying dielectric layer;
    a conductive cap having a bottom surface in contact with, and coextensive with, said top surface of said metal line, wherein said conductive cap includes a non-oxidized metal topmost surface;
    a dielectric material layer contacting said underlying dielectric layer, having a top surface that is coplanar with a top surface of said conductive cap, a bottommost surface that is coplanar with said top surface of said metal line, and being continuously present on, and spanning an entirety of, said top surface of said underlying dielectric layer;

a non-porous dielectric cap layer contacting said porous dielectric material layer and said conductive cap and comprising a different material than said porous dielectric material layer; and an overlying dielectric material having at least one metal line and a metal via embedded therein, wherein a bottom portion of said metal via extends through said non-porous dielectric cap layer and directly contacts said non-oxidized metal topmost surface of said conductive cap.

8. The metal interconnect structure of claim 7, wherein said non-porous dielectric cap layer comprises a silicon nitride.

9. The metal interconnect structure of claim 7, wherein said non-porous dielectric cap layer is a nitrogen-doped hydrogenated silicon carbide.

10. The metal interconnect structure of claim 7, wherein said conductive cap comprises an electrolessly platable metal.

11. The metal interconnect structure of claim 10, wherein said conductive cap comprises a metal selected from CoWP, Ni, Co, Au, and a stack thereof.

12. The metal interconnect structure of claim 7, wherein said conductive cap has faceted sidewalls and a top surface having a lesser area than said bottom surface of said conductive cap.

13. The metal interconnect structure of claim 7, wherein said non-porous dielectric material layer comprises an organosilicate glass.

14. The metal interconnect structure of claim 13, wherein said underlying porous dielectric layer comprises another organosilicate glass.

15. The metal interconnect structure of claim 14, wherein said non-porous dielectric material layer and said underlying porous dielectric layer have a same material composition.

16. The metal interconnect structure of claim 14, wherein said non-porous dielectric material layer and said underlying porous dielectric layer have different material compositions.

17. The method of claim 1, wherein said precleaning said topmost surface of said conductive cap comprises a sputtering process.

18. The method of claim 1, wherein said precleaning said topmost surface of said conductive cap comprises a hydrogen-containing plasma process.

19. A method of forming a metal interconnect structure comprising:
    forming an underlying dielectric layer on a substrate;
    forming a metal line within said underlying dielectric layer, wherein said metal line has a top surface that is coplanar with a top surface of said underlying dielectric layer;
    depositing a conductive cap selectively on said metal line, wherein said conductive cap is not deposited directly on said underlying dielectric layer;
    forming a dielectric material layer over said conductive cap and an entirety of said underlying dielectric layer without exposing said underlying dielectric layer to any preclean; and
    planarizing said dielectric material layer, wherein a planarized top surface of said dielectric material layer is coplanar with a top surface of said conductive cap and a bottommost surface of said dielectric material layer is coplanar with said top surface of said metal line, and wherein planarized dielectric material layer portions of said dielectric material layer remain on said entirety of said underlying dielectric layer.

* * * * *